(12) United States Patent
Delevoye et al.

(10) Patent No.: US 7,414,399 B2
(45) Date of Patent: Aug. 19, 2008

(54) MICROMAGNETOMETER OF THE FLUXGATE TYPE WITH IMPROVED EXCITATION COIL

(75) Inventors: Elisabeth Delevoye, Grenoble (FR); Christian Jeandey, Saint-Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 11/741,951

(22) Filed: Apr. 30, 2007

(65) Prior Publication Data
US 2007/0257669 A1 Nov. 8, 2007

(30) Foreign Application Priority Data
May 4, 2006 (FR) .................... 06 51615

(51) Int. Cl.
*G01R 33/04* (2006.01)
*G01R 33/02* (2006.01)

(52) U.S. Cl. .................... 324/253; 324/249

(58) Field of Classification Search ........... 324/239, 324/249, 252–253, 256–258, 255, 260, 240–244; 338/32 R, 32 H; 73/514.31, 514.39; 336/221
See application file for complete search history.

(56) References Cited
FOREIGN PATENT DOCUMENTS
EP 1 345 036 A2 9/2003
EP 1 484 618 A2 12/2004

OTHER PUBLICATIONS

R. Gottfried-Gottfried, et al., "A Miniaturized Magnetic-Field Sensor System Consisting of a Planar Fluxgate Sensor and a CMOS Readout Circuitry", Sensors and Actuators, XP 000637151, vol. A54, No. 1/3, Jun. 1996, pp. 443-446.
Shoji Kawahito, et al., "High-Resolution Micro-Fluxgate Sensing Elements Using Closely Coupled Coil Structures", Sensors and Actuators, XP 004077934, vol. 54, No. 1-3, Jun. 1996, pp. 612-617.
H. Joisten, et al., "Microfluxgate Performance Improvement in Microtechnology", IEEE Transation on Magnetics, vol. 41, Nov. 2005, pp. 4356-4358 (1-3).

(Continued)

*Primary Examiner*—Bot LeDynh
(74) *Attorney, Agent, or Firm*—Oblon, Spivak, McClelland, Maier & Neustadt, P.C.

(57) ABSTRACT

The invention relates to a fluxgate micromagnetometer implemented in thin layers, fitted with at least one excitation coil with an arrangement and a structure that bring improvements particularly in terms of the magnetometer footprint, reduction in the "offsets" of measurements taken by the magnetometer, common mode rejection.

29 Claims, 7 Drawing Sheets

OTHER PUBLICATIONS

H. Kurata, et al., "Study of Thin Film Micro Transformer With High Operating Frequency and Coupling Coefficient", IEEE Transations on Magnetics, vol. 29, No. 6, Nov. 1993, pp. 3204-3206.

Jae Park, et al., "Magnetic Devices Research", MEMS Magnetic Devices Research, http://mems.mirc.gatech.edu/research/magnetic, Aug. 25, 2005, pp. 1-10.

Chong H. Ahn, et al., "A Comparison of Two Micromachined Inductors (Bar- and Meander-Type) for Fully Integrated Boost DC/DC Power Converters", IEEE Transactions on Power Electronics, vol. 11, No. 2, Mar. 1996, pp. 239-245.

Y. Kobayashi, et al., "New Type Cloth-Inductor and Transformer With Thin Amorphous Wires and Multi-Thin Coils", IEEE Transactions on Magnetics, vol. 28, No. 5, Sep. 1992, pp. 3012-3014.

H. Matsuki, et al., "A New Cloth Inductor Using Amorphous Fiber", IEEE Transactions on Magnetics, vol. 21, No. 5, Sep. 1985, pp. 1738-1739.

Jun-Bo Yoon, et al., "High Performance Electroplated Solenoid-Type Integrated Inductor ($SI^2$) for RF Applications Using Simple 3D Surface Micromachining Technology", IEDM, 1998, pp. 544-547.

J. M. Leger, et al., "Integrated Microfluxgate Study and Characterization", Proc. Eurosensors XI, vol. 1, 1997, pp. 267-270.

MICROMAGNETOMETER OF THE FLUXGATE TYPE WITH IMPROVED EXCITATION COIL

TECHNICAL FIELD

The invention relates to the field of microtechnologies and magnetometers or magnetic sensors, and implements a magnetometer device of the fluxgate type implemented in thin layers, fitted with a magnetic circuit with at least one excitation coil, at least one detection coil, the excitation coil having in particular an improved arrangement and structure.

The device according to the invention brings improvements particularly in terms of the magnetometer footprint, measurement accuracy, particularly as regards measurement "offset" reduction, common mode rejection.

PRIOR ART

"Fluxgate" magnetometers are used to measure magnetic fields which may be weak or even very weak, for example of the order of one microtesla with a resolution of the order of one nanotesla or even of the order of a number of picoteslas, depending on the dimensions of the magnetometer. A magnetometer of the "fluxgate" type is conventionally fitted with: a sensor, excitation means or an excitation circuit able to deliver a periodic excitation signal to the sensor, and detection means or a detection circuit at the sensor output. The sensor generally includes a magnetic circuit formed of a magnetic core, and one or more coils responsible for magnetic circuit excitation and one or more "receiver" or "detection" coils responsible for measurement. These elements operate in conjunction. Detection may for example be carried out at twice the frequency of the excitation signal, as in fluxgate magnetometers of the so-called "Vacquier" or so-called "Foster" type.

In FIG. 1A, a first example of a fluxgate magnetometer of the "Vacquier" type, and in particular the magnetic circuit of this magnetometer associated with excitation and detection coils, is given. The magnetic circuit is open and includes a first core 2, and a second core 4 parallel to the first core 2. The excitation coil 6 is formed of a first succession of turns 6a wound around the first core 2, connected in series to a second succession of turns 6b wound around the second core 4. The detection coil 8 is formed of a succession of turns 8a wound around the first core 2, connected in series to a succession of turns 8b wound around the second core 4. The excitation coil 6 and the detection coil 8 may be interlaced.

In FIG. 1B, a second example of a magnetic circuit of a fluxgate magnetometer of the "Foster" type associated with excitation and detection coils is shown. In this device the magnetic circuit is also formed of a first core 2, and of a second core 4 parallel to the first core 2. An excitation coil 6, with an arrangement similar to that of the "Vacquier" device previously described, is provided. The detection coil 10 is formed of a succession of turns wound around the first core 2 and the second core 4, the turns passing alternately in a plane located above the two cores 2 and 4 then in another plane located below the two cores 2 and 4. The excitation coil 6 and the detection coil 8 may also be interlaced.

In one or other of the fluxgate magnetometers previously described, the magnetometer measures an external field $H_0$ to which it is subjected by a method of adding together the signals coming from the cores 2 and 4, which are excited by a magnetic field $H_{exc}$ produced by the excitation coil 6. The arrangement of the coils is such that if a field for example equal to $H_{exc}+H_0$ is produced in the first core 2, a field $-H_{exc}+H_0$ is produced in the second core 4. The signal collected at the detection coil output generally comprises an offset which proves to be particularly significant when the order of magnitude of the magnetic field to be measured is weak.

Magnetometers can be applied to the field of micro-technology and be incorporated for example in integrated circuits. They are then manufactured using techniques of implementation in thin layers. Magnetometers formed in thin layers can reach sizes of the order of less than one millimeter, with thin layers which can be of the order of one micrometer or less.

An excitation coil 25, wound around a magnetic core 22 of a magnetic circuit of a magnetometer, is shown in FIG. 2. The magnetic core 22 extends in a given main direction (parallel to a vector $\vec{i}$ of an orthogonal marker [O; $\vec{i}$; $\vec{j}$; $\vec{k}$] defined in FIG. 2) and rests on a support which can be in the form of a substrate 20 covered with a stack 21 of thin layers. The excitation coil 25 is formed of a first plurality of conductive zones 26 formed in a plane located between the substrate 20 and the core 22 and a second plurality of conductive zones 28 located above the magnetic core 22, each conductive zone of the second plurality of conductive zones 28 being connected to a conductive zone of the first plurality of conductive zones 26 by means of a vertical interconnection 27 commonly known as "via". In this device, the arrangement of the excitation coil is such that the conductive zones of the second plurality of conductive zones 28 form a non-zero angle α with a plane orthogonal to the main direction of the core 22. Furthermore the excitation coil 25 is not interlaced with a detection coil (not shown).

The documents: "Integrated microfluxgate study and characterization", Proc. Eurosensors XI, vol. 1, 199, p. 267-270, Léeger et al., and "Microfluxgate Performance Improvement in Microtechnology", Joisten and al., November 2005, IEEE transaction on magnetics, vol. 41 issue 11 p. 4356-4358, show a fluxgate magnetometer that includes: two cores 32, 34, connected to each other and forming a closed magnetic circuit, excitation coils 36, 37, wound around the cores 32, 34, of the magnetic circuit on either side of a detection coil 38 (FIG. 3). This device is different from the one described previously in conjunction with FIG. 3, particularly in that the excitation coils comprise turns located respectively in a plain orthogonal to the cores 32, 34 which may make it possible to obtain a more significant induced magnetic field amplitude. However in a device of this kind, as in the one previously described in conjunction with FIG. 3, the excitation and detection coils are arranged around the core in distinct zones, which poses a footprint problem.

Another example of a thin layer embodiment of a fluxgate magnetometer according to the prior art, and in particular a micro-technology device that includes the magnetic circuit of the magnetometer associated with excitation and detection coils, is shown in a view from above in FIG. 4A and in a cross-section view X'X in FIG. 4B (the cross-section X'X being indicated in FIG. 4A by an axis parallel to a vector $\vec{i}$ of an orthogonal marker [O; $\vec{i}$; $\vec{j}$; $\vec{k}$]. This device includes an excitation coil 42 and a detection coil 44 interlaced and arranged around a magnetic core 40. The excitation coil 42 and the detection coil 44 in particular comprise a first series of parallel conductive zones 46 located above the magnetic core 40 and a second series of parallel conductive zones 48 located below the magnetic core 6. For each of the excitation 42 and detection 44 coils, the conductive zones 46 of the first series are located opposite the conductive zones 44 of the second series. The conductive zones 46 of the first series and the conductive zones 44 of the second series are also connected by means of vertical interconnections 49 commonly known as "via". The excitation 42 and detection 44 coils form a solenoid respectively.

The problem is posed of finding a new fluxgate magnetometer device which offers improvements in terms of footprint and measurement performance.

DISCLOSURE OF THE INVENTION

The purpose of the invention is to present a magnetometry device or magnetometer implemented in thin layers, that includes a magnetic circuit formed of several cores and at least one excitation coil that has an improved structure and arrangement relative to the cores. The excitation coil has a structure different from that of a conventional solenoid. The arrangement of the excitation coil makes it possible to avoid the distributed line or phase shift effects that are found with conventional excitation coil arrangements.

The excitation coil may be formed of a succession of closed conductive contours surrounding the cores, the conductive contours being connected in series.

A conductive contour is taken to mean an electrically conductive part that forms a collar around the cores.

The number of cores in a micromagnetometer or magnetometer according to the invention is not restricted to two. The excitation coil may be formed of a succession of closed conductive contours surrounding more than two cores, the conductive contours being connected to each other.

The invention allows the magnetic phenomena induced by the cores to be synchronised spatially.

The invention relates first of all to a micromagnetometer of the fluxgate type implemented in thin layers, including:
  a support having a given main plane,
  a magnetic circuit fitted with at least one first magnetic core of given main direction and at least one second magnetic core parallel to the first core,
  at least one excitation coil formed of a succession of conductive elements connected in series,
  means for applying an excitation signal to said series of conductive elements,
  the excitation coil comprising: flat conductive zones parallel to each other extending in a direction that forms a non-zero angle with said given main direction and located respectively in a plane parallel to the main plane of the support, a first plurality of flat conductive zones being located opposite the first core, a second plurality of flat conductive zones being located opposite the second core, at least several conductive elements of the excitation coil being formed respectively: of at least one first flat conductive zone of said second plurality of conductive zones connected to a second flat conductive zone of said first plurality of flat conductive zones and located in the same plane orthogonal to the main plane of the support as said second flat conductive zone.

The conductive elements of the excitation coil may be formed respectively of a conductive part implementing a closed contour surrounding the cores or a collar surrounding the cores, and including said first flat conductive zone and said second flat conductive zone.

With an arrangement of conductive elements of this kind, any parasitic effects that might be induced by a potential geometric imperfection in a conductive element are not passed on to subsequent conductive elements.

The magnetometer may also include at least one detection coil.

Said flat conductive zones of said first plurality of flat conductive zones and of said second plurality of flat conductive zones, may be orientated along a direction orthogonal to said given main direction.

The conductive elements of the excitation coil may be formed respectively:
  of a conductive part implementing a closed contour surrounding the cores or a collar surrounding the cores, and including said first flat conductive zone and said second flat conductive zone,
  of a first conductive link connected to said conductive part and intended to route a current coming from a preceding conductive element of said series of conductive elements or means for applying the excitation signal,
  of a second conductive link connected to said conductive part and intended to transmit a current to a next conductive element of said series of conductive elements or to the means for applying the excitation signal.

According to this possible embodiment, said first flat conductive zone and said second flat conductive zone are located in a first plane parallel to the main plane of the support, said second flat conductive zone being connected and aligned with said first flat conductive zone.

The conductive part implementing a closed conductive contour may additionally include: a third flat conductive zone and a fourth flat conductive zone connected to, and aligned with, the third flat conductive zone, the third flat conductive zone and the fourth flat conductive zone being connected respectively to said first flat conductive zone and to said second flat conductive zone and being located in a second plane, parallel to the main plane of the support and such that the cores are placed between said first plane and said second plane.

According to the second possibility, the third flat conductive zone and fourth flat conductive zone may be located in the same plane orthogonal to the main plane of the support as said first flat conductive zone and second flat conductive zone.

The conductive part implementing a closed contour may be formed of a first conductive portion partially surrounding the first core and of a second conductive portion partially surrounding the second core, the first conductive portion and the second conductive portion being identical.

The first conductive link and the second conductive link may be located between the cores and orientated in a direction parallel to the given main direction, the second link and the first link being located respectively in a first plane parallel to the main plane of the support, and in a second plane, parallel to the main plane of the support and such that the cores are placed between the first plane and the second plane.

The device according to the invention may additionally include at least one detection coil wound around the cores, and possibly arranged in such a way that the detection coil and the excitation coil are interlaced.

According to one possible embodiment, the detection coil may be formed of a succession of turns passing respectively alternately, opposite all the cores in a first plane parallel to the main plane of the support and opposite all the cores in a second plane parallel to the main plane of the support and such that the cores are located between the first plane and the second plane.

According to one variant, the detection coil may be formed of a succession of conductive turns connected in series, a plurality of turns of the detection coil comprising respectively: a plurality of flat conductive zones parallel to each other, located respectively opposite the cores of the magnetic circuit in a plane parallel to the main plane of the support and extending respectively in a direction forming a non-zero angle with said given main direction, the flat conductive zones of the detection coil having a width $1'c$ greater than the width $1c$ of the flat conductive zones of the excitation coil.

The invention also relates to a device that includes:
- a first micromagnetometer of the fluxgate type as defined above, fitted with cores orientated along a first main direction,
- at least one second micromagnetometer of the fluxgate type as defined above, fitted with cores orientated along a second main direction orthogonal to said first main direction.

BRIEF DESCRIPTION OF THE DRAWINGS

The present invention will be better understood from reading the description of embodiment examples given purely for information and in no way restrictively, with reference to the appended drawings in which.

Parts that are identical similar or equivalent in the different figures carry the same numerical references to make it easy to switch from one figure to the other.

The different parts shown in the figures are not necessarily shown to a uniform scale, in order to make the figures easier to read.

DETAILED DISCLOSURE OF PARTICULAR EMBODIMENTS

Figure 1A:
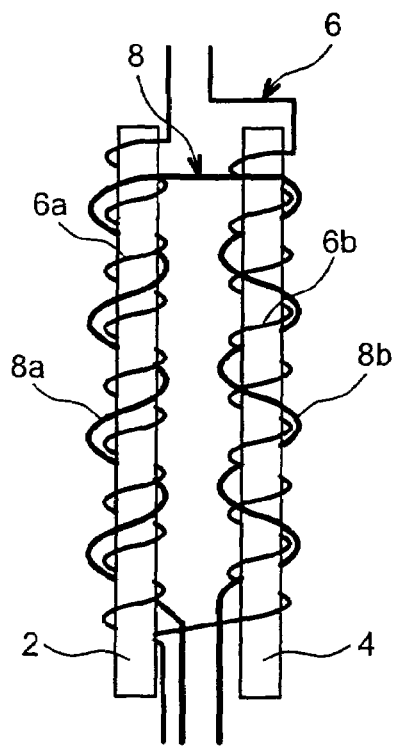
FIGS. 1A, 1B, show respectively an arrangement of "Vacquier" coils in a fluxgate magnetometer according to the prior art, and another arrangement of "Foster" coils in a fluxgate magnetometer according to the prior art.
Figure 1B:
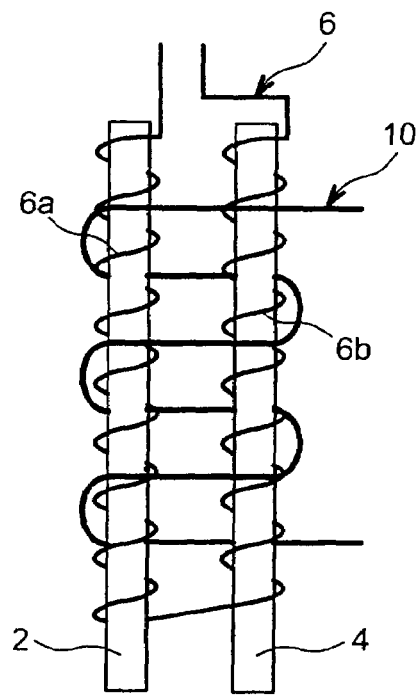
Figure 2:
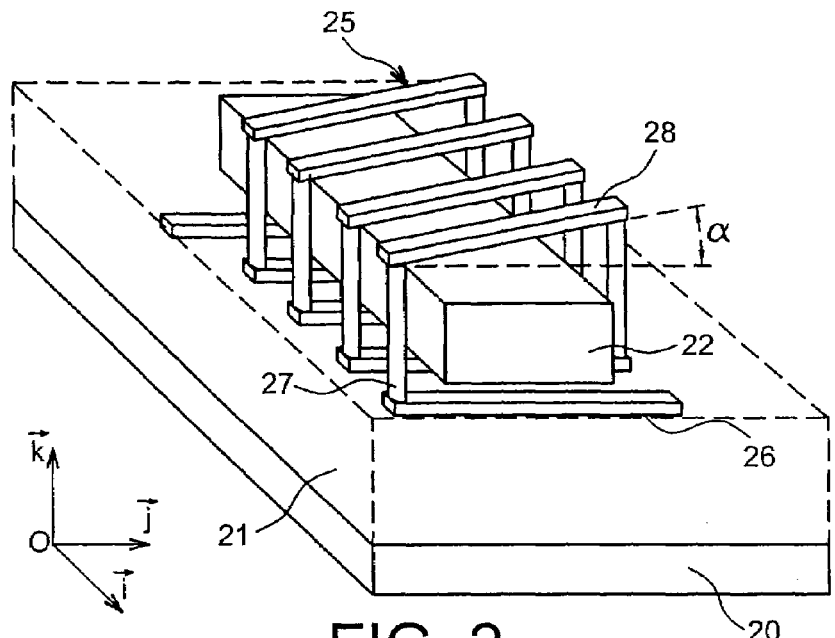
FIG. 2 shows an example of an excitation coil arrangement in a fluxgate micromagnetometer according to the prior art.
Figure 3:
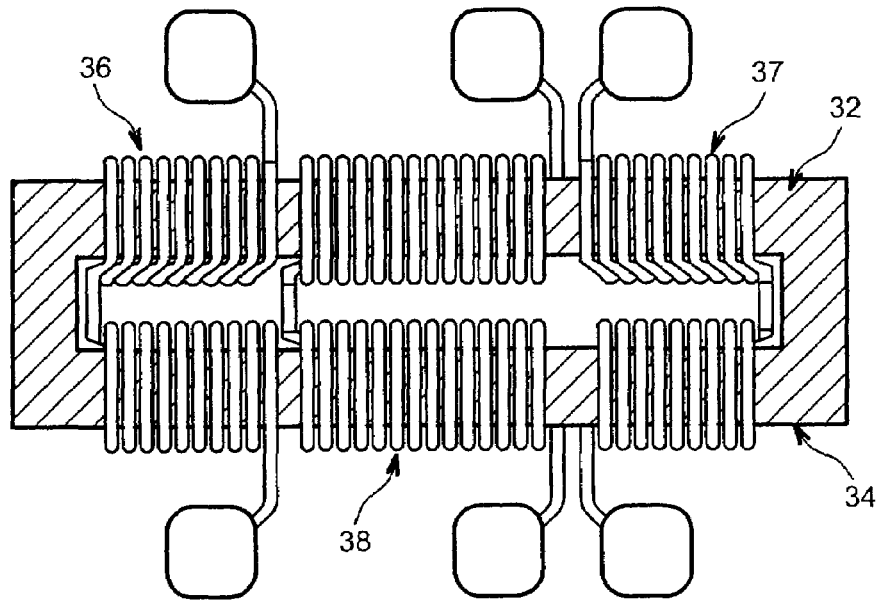
FIG. 3 shows another example of an excitation coil arrangement in a fluxgate micromagnetometer according to the prior art.
Figure 4A:
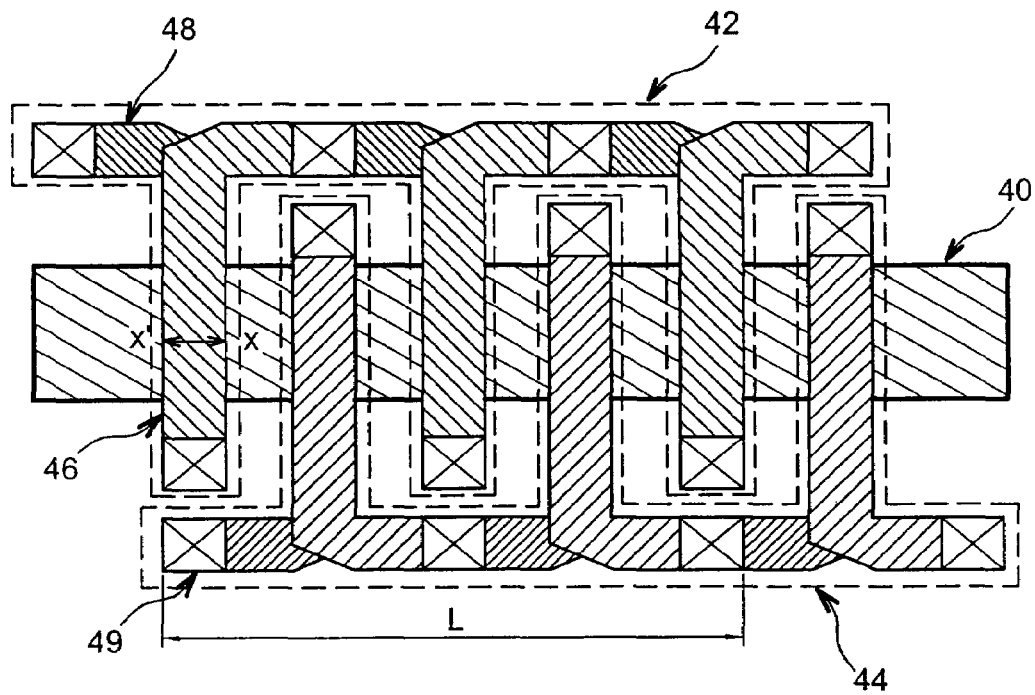
FIGS. 4A, 4B, show in a view from above and in a cross-section view, another example of an excitation coil and detection coil arrangement in a fluxgate micromagnetometer according to the prior art.
Figure 4B:
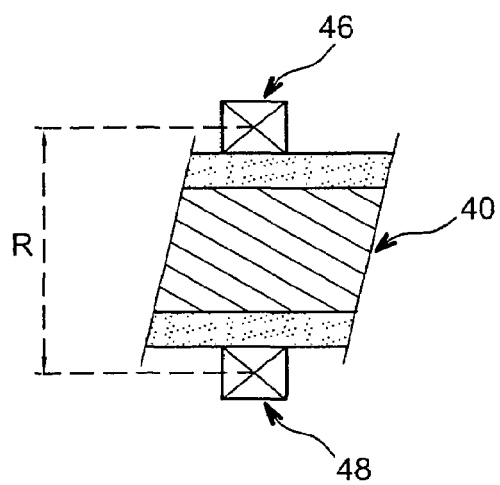
Figure 5A:
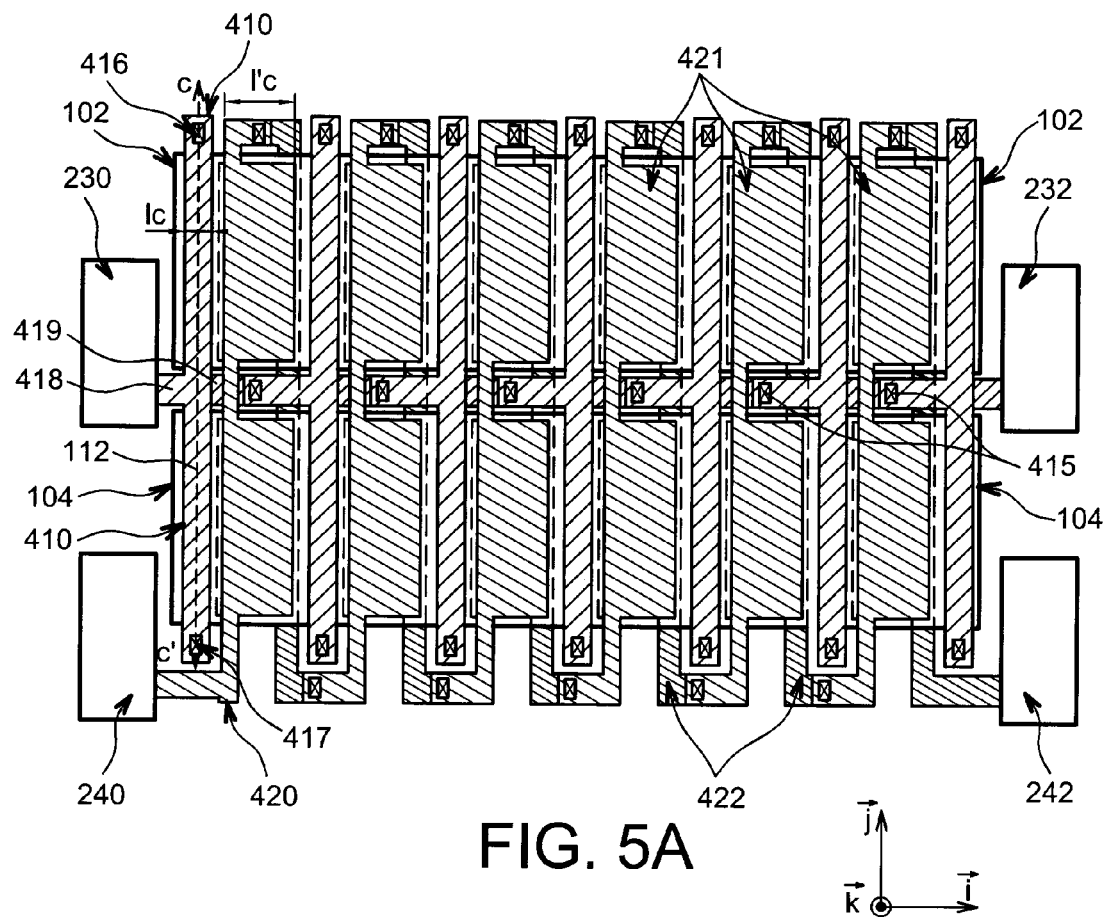
FIGS. 5A, 5B, show an example of a fluxgate magnetometer according to the invention, fitted with an excitation coil and a detection coil that have a particular structure and arrangement respectively.
Figure 5B:
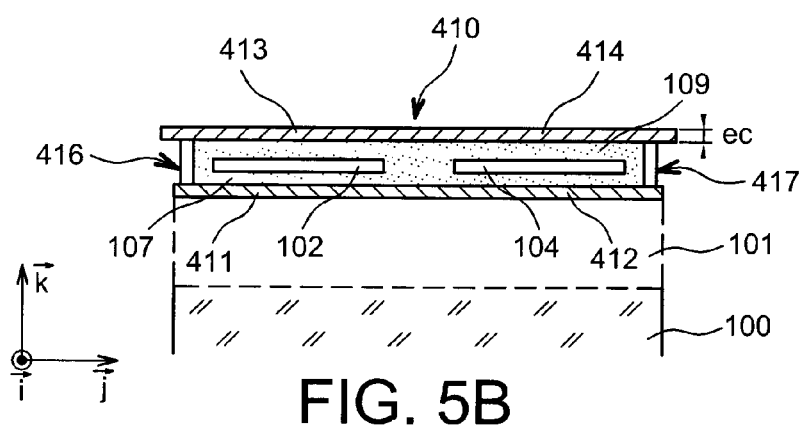

One example of a fluxgate micromagnetometer implemented in thin layers, and in particular a device including a magnetic circuit associated with an excitation coil 410 and a detection coil 420, is shown in FIGS. 5A and 5B, the device being shown in a view from above in FIG. 5A, and in a cross-section view C'C in FIG. 5B (the cross-section C'C being indicated in FIG. 5A). This device comprises in particular an excitation coil 410 of improved arrangement and structure. The detection coil 420 may also have an improved arrangement and structure.

The magnetic circuit is implemented on a support, which may be in the form of a substrate 100, for example one that is a semiconductor, covered by a stack 101 of thin layers. The magnetic circuit is formed of a first magnetic core 102 having a given main direction (the main direction of the first core 102 being defined in FIGS. 5A, 5B, by a direction parallel to the vector $\vec{i}$ of an orthogonal marker $[O; \vec{i}; \vec{j}; \vec{k}]$ and of a second magnetic core 104 of main direction parallel to that of the first core 102.

In this example, the first core 102 and the second core 104 are not connected to each other and are located in the same plane parallel to the main plane of the support (the main plane of the support being defined as a plane passing through the substrate 100 or the stack 101, and parallel to the plane $[O; \vec{i}; \vec{j}]$ of the orthogonal marker $[O; \vec{i}; \vec{j}; \vec{k}]$).

The first magnetic core 102 and the second magnetic core 104 may for example be in the form of parallelepiped blocks based on a magnetic material, such as FeNi for example, resting on a layer of dielectric material. The cores 102 and 104 have a respective length (measured in a direction parallel to the vector $\vec{i}$ of the marker $[O; \vec{i}; \vec{j}; \vec{k}]$), which may for example be between 100 μm and 10,000 μm or of the order of 1,000 μm.

The respective width of the cores 102 and 104 (measured in a direction parallel to the vector $\vec{j}$ of the orthogonal marker $[O; \vec{i}; \vec{j}; \vec{k}]$) may for example be between 10 μm and 1,000 μm, or of the order of 100 μm. The cores 102 and 104 have a respective thickness (measured in a direction parallel to the vector $\vec{k}$ of the marker $[O; \vec{i}; \vec{j}; \vec{k}]$) which may for example be between 0.1 μm and 50 μm, or between 1 μm and 5 μm.

The excitation 410 and detection 420 coil may be interlaced.

The excitation 410 and detection 420 coil comprise a plurality of flat conductive zones. Some flat conductive zones are placed in a first plane parallel to the main plane of the support for example located below the cores 102, 104, while the other flat conductive zones are located in a second plane, for example parallel to the main plane of the support and above the cores 102, 104. Said flat conductive zones are parallel to each other, and extend respectively in a direction forming a non-zero angle, for example in an orthogonal direction, with the main direction of the first core 102 (the main direction of the first core 102 being a direction parallel to the vector $\vec{i}$ of an orthogonal marker $[O; \vec{i}; \vec{j}; \vec{k}]$ in FIG. 5A). "Flat conductive zone" will be taken throughout the present description to mean a metal block that is parallelepiped or substantially parallelepiped in shape.

The flat conductive zones 411, 412, 413, 414, may have a width $1c$ (measured in FIG. 5A in a direction parallel to the vector $\vec{i}$ of the orthogonal marker $[O; \vec{i}; \vec{j}; \vec{k}]$) greater than their respective thickness $e_c$ (measured in FIGS. 5A and 5B in a direction parallel to the vector $\vec{k}$ of the orthogonal marker $[O; \vec{i}; \vec{j}; \vec{k}]$), for example a width $1c$ at least twice the size of their thickness $e_c$ or at least three times the size of their thickness $e_c$. The conductive zones 411, 412, 413, 414, may have a thickness $e_c$ of between 0.1 μm and 50 μm, or for example of between 1 μm and 5 μm, or for example of the order of 3 μm. The conductive zones 411, 412, 413, 414, may also have a respective width $1c$ of between 1 μm and 50 μm, for example of the order of 10 μm, or for example of the order of 3 μm.

A layer 107 of dielectric material with a thickness for example of between 0.1 µm and 10 µm, or for example between 0.1 µm and 3 µm, preferably less than 1 micrometer, is located between the cores 102 and 104 and said flat conductive zones 411, 412 placed in the first plane. Another layer 109 of dielectric material with a thickness of between 0.1 µm and 10 µm for example, or between 0.1 µm and 3 µm for example, preferably less than 1 micrometer, separates the cores 102 and 104 of said flat conductive zones 413, 414 located in the second plane.

The excitation coil 410 is formed of a succession of conductive elements connected in series along the cores 102 and 104. The conductive elements of the excitation coil may be formed respectively: of a conductive part implementing a closed contour around the two cores 102 and 104, of a first conductive link 418 connected to said conductive part and of a second conductive link 419, different from the first link 418 and also connected to said conductive part. The conductive part implementing a closed contour may be formed of a first conductive portion partially surrounding the first core 102 and of a second conductive portion partially surrounding the second core 104 (FIG. 5B, the second link not being shown in this figure). The first conductive portion and the second conductive portion may be U-shaped. The first conductive portion and the second conductive portion may be identical.

The first link 418 and the second link 419 may be orientated in a direction parallel to the given main direction of the cores 102 and 104, and located in the first plane and in the second plane respectively. In the conductive elements of the excitation coil, one of said first link 418 or second link 419, is intended to route a current I, towards said conductive part implementing a closed contour around the two cores 102, 104, whereas the other of said second link 419 or first link 418, is intended to route a current I coming from said conductive part implementing a closed contour. In the case of a given conductive element located at one end of the excitation coil, one of said first link or second link of this given conductive element, is connected to a conductive contact 230, 232, by which an excitation signal is intended to be applied, whereas the other of said first link and second link is connected to another conductive element of the excitation coil 410. For the other conductive elements of the excitation coil 410, one of said first link or second link, for example the first link 418, is connected to a previous conductive element of the succession of conductive elements forming the excitation coil 410, whereas the other of said first link or second link, for example the second link 419, is connected to a next conductive element of the succession of conductive elements forming the excitation coil 410. The conductive elements of the excitation coil are arranged such that a current I reaching one of said conductive elements, passes through one of the links 418, 419, connected to said conductive part forming a closed contour, for example through the first link 418, then is divided into two current components between the two portions forming said conductive part, at the output of the conductive element, the two components being reassembled on the other of the two links, for example on the second link 419.

In this embodiment, the current is divided in a synchronous way between said two conductive portions of the conductive part implementing a closed contour around the first core 102 and the second core 104. With an arrangement of conductive elements of this kind, any parasitic effects that might be induced by a possible geometric imperfection in a conductive element are not passed on to subsequent conductive elements.

The conductive elements of the excitation coil 410 may be formed respectively, in particular, of a first flat conductive zone 411 located in the first plane opposite the first core 102, and extending in a direction orthogonal to the given main direction, connected to a second flat conductive zone 412 located opposite the second core 104 extending in a direction orthogonal to the given main direction. The second flat conductive zone 412 is aligned with the first flat conductive zone 411 and located in the extension thereof. The conductive elements of the excitation coil 410 are formed moreover respectively: of a third flat conductive zone 413 located in the second plane opposite the first core 102, and extending in the direction orthogonal to the given main direction, and a fourth flat conductive zone 414, connected to the third flat conductive zone 413, the fourth flat conductive zone 414 being located opposite the second core 104. The third flat conductive zone 413 is aligned with the fourth flat conductive zone 414 and located in the extension thereof. The first flat conductive zone 411 and the third flat conductive zone 413 may be stacked one on top of the other. The second flat conductive zone 412 and the fourth flat conductive zone 414 may also be stacked one on top of the other. A first vertical interconnection 416 or first via 416, orthogonal to the main plane of the support, may be provided to connect the first flat conductive zone 411 to the third flat conductive zone 413. A second vertical interconnection 417 or second via 417, orthogonal to the main plane of the substrate connects the second flat conductive zone 412 to the fourth flat conductive zone 414. The first flat conductive zone 411, the second conductive zone 412, the third flat conductive zone 413, the fourth flat conductive zone 414, the first vertical interconnection 416, and the second vertical interconnection 417, form said conductive part implementing a closed contour around the cores 102, 104.

Successive conductive elements of the excitation coil 410 may be connected to each other through vertical interconnections 415, connecting one of said first link 418 or second link 419 of a conductive element to another of said second link or first link of another conductive element.

The detection coil 420 is formed of a succession of conductive turns connected in series along the cores 102 and 104. The turns of the detection coil 420 may have an arrangement of the type commonly known as "Foster".

The detection coil 420 is formed of a succession of turns wound around the first core 102 and the second core 104, the turns passing alternately in the second plane opposite the cores 102, 104, then in the first plane opposite the cores 104, 102. The detection coil 410 is also formed, in particular, of different flat conductive zones 421, 422, distributed along the cores 102, 104, and located in the first plane, or in the second plane. Said flat conductive zones 421, 422 of the detection coil 420 are parallel to each other, and extend respectively in a direction forming a non-zero angle, for example in an orthogonal direction, with the main direction of the first core 102. The flat conductive zones of the detection coil 420 may have a respective width $1'c$ that is larger (for example at least twice as large) than the respective width $1c$ of the flat conductive zones of the detection coil 420 (the widths $1c$ and $1'c$ being measured in FIG. 9A in a direction parallel to the vector $\vec{i}$ of the orthogonal marker [O; $\vec{i}$ ; $\vec{j}$ ; $\vec{k}$ ]). The width $1'c$ of the flat conductive zones of the detection coil 420 may for example be between 5 µm and 30 µm, whereas the width $1c$ of the flat conductive zones of the excitation coil 410 may for example be between 5 µm and 15 µm.

A detection coil 420 formed of conductive zones that are wider than that of the excitation coil 410 may allow magnetometer sensitivity to be improved and the counter reaction field to be homogenised, in order to work field-free.

The device also comprises conductive contacts 230, 232, 240, 242. A first conductive contact 230 and a second conductive contact 232 are connected respectively to a first conductive element of the excitation coil 410 located at a first end of the cores 102, 104, and to a second conductive element of the excitation coil 410 located at a second end of the cores 102, 104. A third conductive contact 240 and a fourth conductive contact 242 are connected respectively to a first turn of the detection coil 120 located at a first end of the cores 102, 104 and to a second turn of the detection coil 120 located at a second end of the cores 102, 104.

With a device like the one previously described, the excitation field can be cancelled in the detection coil. The signal detected is doubled without the noise being increased proportionally. With an arrangement of this kind, the noise sources are not correlated between the two cores.

Figure 8:
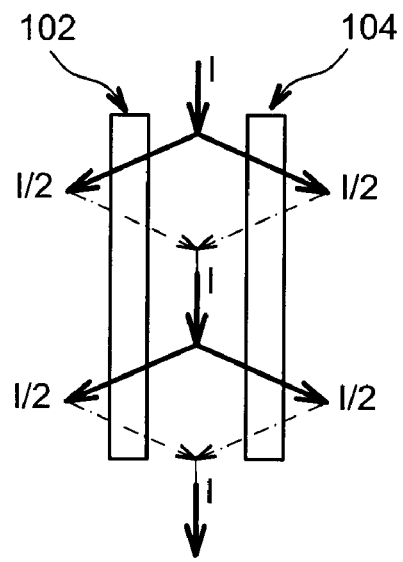
FIG. 8 shows an equivalent electrical diagram of the excitation implemented using the micromagnetometer in FIG. 6.

In FIG. 8, an equivalent electrical diagram of the excitation implemented around the two cores 102, 104 is given.

The excitation is implemented such that a current I, flows in accordance with a first revolution around the cores 102, 104, subdividing itself into 2 contributions I/2 each flowing around one of the two cores. Then at the end of this first revolution, the two contributions I/2 are added together to recreate the total current I which will be subdivided again into 2 contributions I/2 around each of the 2 cores, so as to effect the second revolution and again added together to recreate the total current I and so on as far as the other end of the magnetic circuit.

Figure 6:
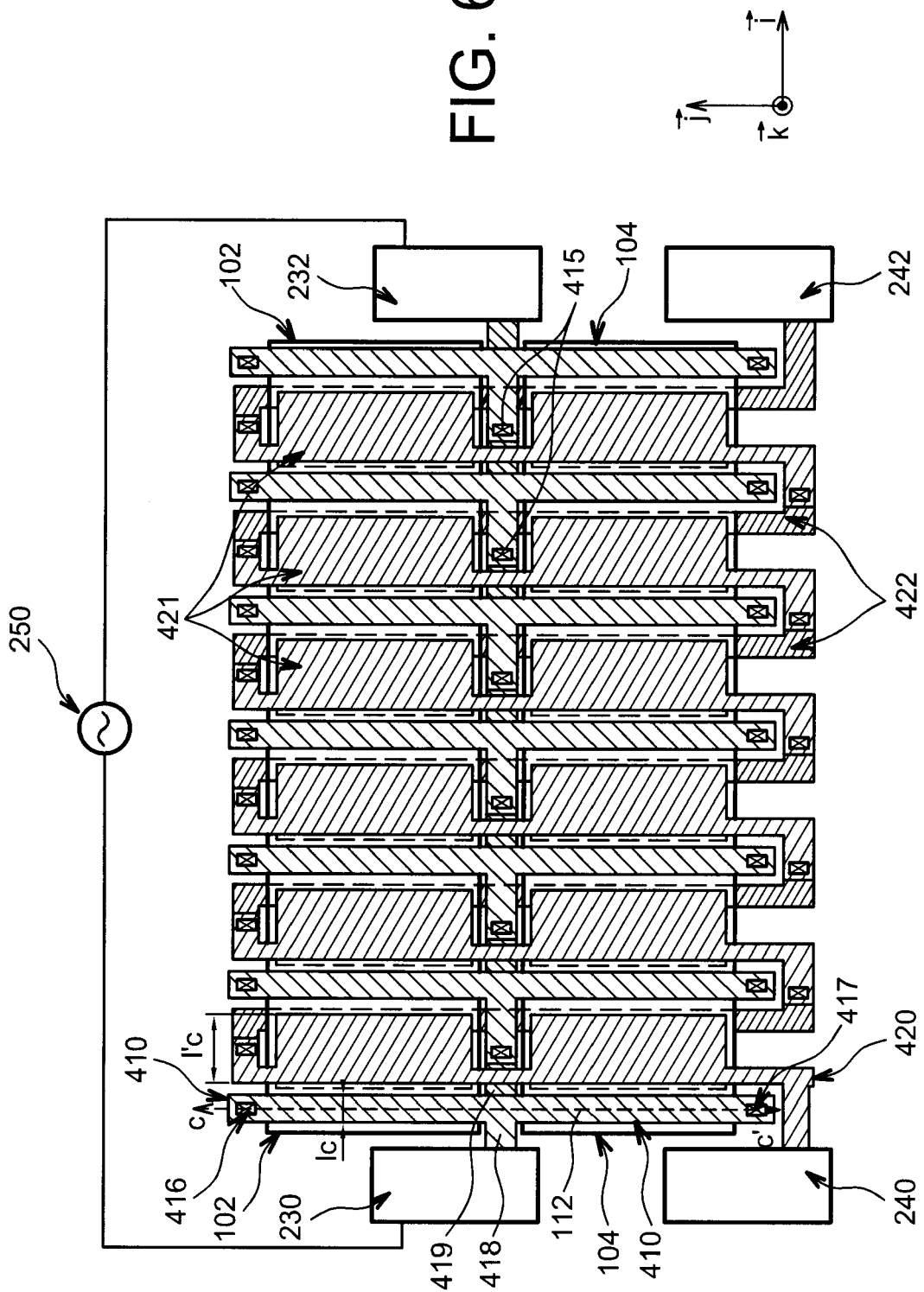
FIG. 6 shows an example of an excitation coil and detection coil arrangement and structure in a fluxgate micromagnetometer according to the invention.

The first conductive contact 230 and the second conductive contact 232 may be connected to an excitation signal generator 250 and provided so as to route the excitation signal to the cores 102 and 104 (FIG. 6).

A variant (not shown) of the device which has just been described comprises a closed magnetic circuit. For a variant of this kind, the cores 102 and 104 are connected by means of two zones based on a magnetic material forming a third core, and a fourth core respectively, the third core and the fourth core being joined to the first core 102 and the second core respectively and orientated in a direction orthogonal to the main direction of the first core 102 and the second core 104. The first core 102, the second 104, the third core, and the fourth core, implement a closed contour.

Figure 7:
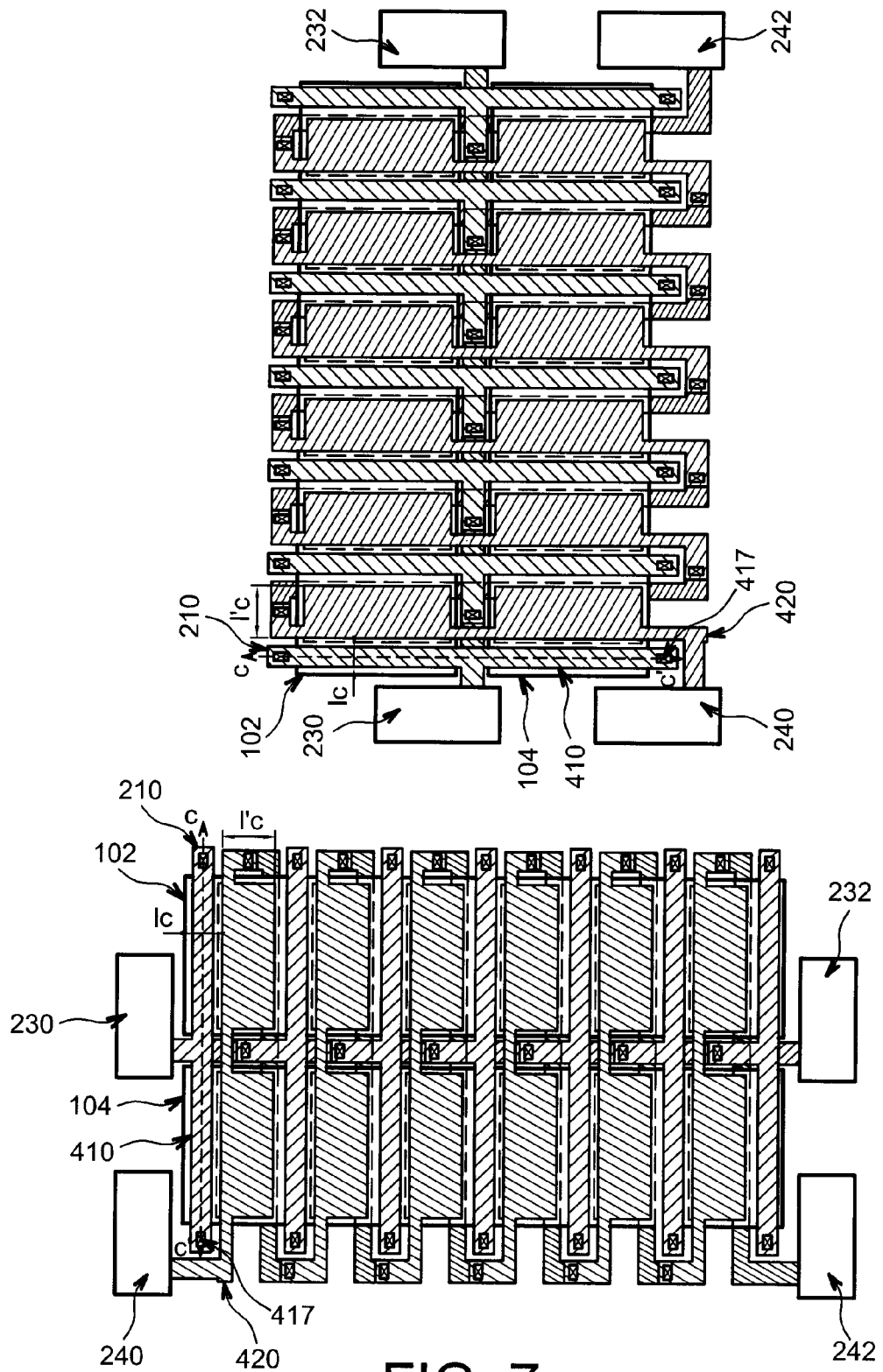
FIG. 7 shows an example of a 2-axis micromagnetometer according to the invention.

A 2-axis micro-fluxgate device is shown in FIG. 7.

This device includes a first fluxgate micromagnetometer M1 as shown previously in conjunction with FIG. 6, comprising a first magnetic circuit fitted with the first core 102, the second core 104, the excitation coil 410 and the detection coil 420 previously described.

The 2-axis micro-fluxgate additionally includes a second fluxgate magnetometer M2, fitted with a second magnetic circuit including two other juxtaposed cores 102 and 104, and another excitation coil 410 and another detection coil 420. The second micromagnetometer M2 has a structure identical to that of the first micromagnetometer M1, and is fitted with cores 102, 104, extending in a second given main direction to that of the cores of the first magnetometer M1.

The first magnetic circuit associated with the coils 410, 420 is provided to take magnetic field measurements along said first main direction, whereas the second magnetic circuit associated with the other coils 410, 420 is provided to take magnetic field measurements along a second direction, orthogonal to said first main direction.

According to another example, a fluxgate micromagnetometer according to the invention, may be fitted with a number k (with k an integer greater than 2, for example equal to 5) parallel magnetic cores juxtaposed on a support. The micromagnetometer is also fitted with an excitation coil 410 and with a detection coil 420 that are interlaced.

By using a device with N pairs of cores rather than one single pair it is possible to increase the signal-to-noise ratio by a square root relationship of 2*N, the detected signal being increased in the ratio 2*N and the noise in a square root relationship of 2*N.

Typically, if a device with 5 pairs of cores is used, the signal-to-noise ratio can be improved in a ratio of about 3.16 or $\sqrt{10}$.

It is also possible to opt to improve the signal-to-noise ratio without increasing the signal by reducing the number of conductive contours of the excitation coil per core.

A variant of the fluxgate micromagnetometer according to the invention may be fitted with a number k with k equal to 6 cores 402, 404, 502, 504, 602, 604.

Figure 9:
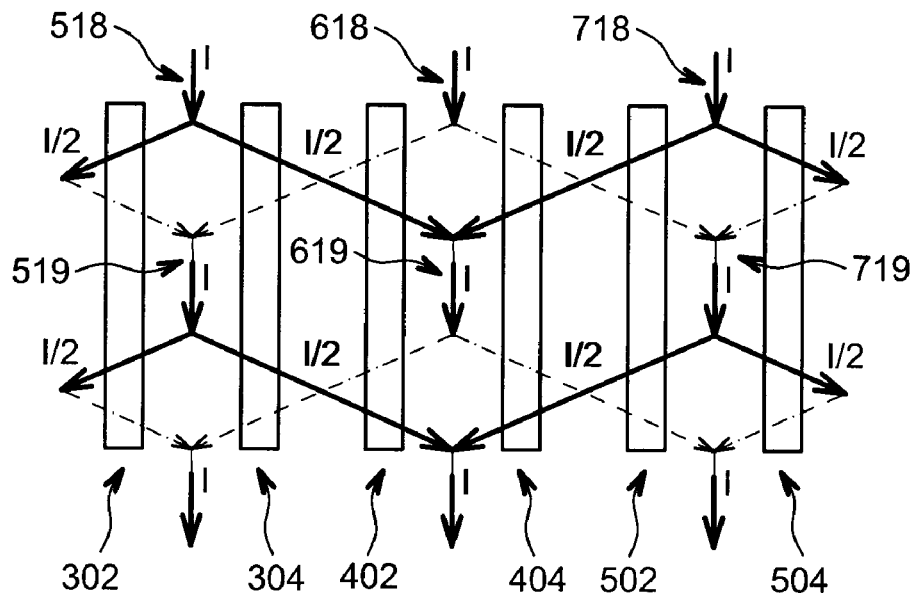
FIG. 9 shows an equivalent electrical diagram of the excitation of an example of a fluxgate magnetometer according to the invention, fitted with a number of cores greater than 2.

In FIG. 9, an equivalent electrical diagram of the excitation of a device of this kind implemented around the cores 302, 304, 402, 404, 502, 504 is given, the flat conductive zones of the excitation coil located below the cores being schematised in discontinuous lines, while the flat conductive zones of the excitation coil located above the cores, are schematised in solid lines.

In the case of k cores, the excitation coil can be arranged so as to increase the total contribution of the current from I to k*1, each pair of cores receiving a current contribution I and each core a current contribution I/2. The way of subdividing and adding together the contributions I/2 may be modified relative to the device in FIG. 8.

The conductive elements of the excitation coil may be formed respectively: of a conductive part implementing a closed contour around the 6 cores 302, 304, 402, 404, 502, 504. A first link 518 located between the cores 302, 304, a second 618 located between the cores 402, 404, and a third link 718 located between the cores 502, 504, are each intended to route a current I towards said conductive part implementing a closed contour around the 6 cores 302, 304, 402, 404, 502, 504. A fourth link 519 located between the cores 302, 304, a fifth link 619 located between the cores 302, 304, and a sixth 719 located between the cores 302, 304, are intended to route a current I coming from that conductive part implementing a closed contour.

The conductive elements of the excitation coil are arranged such that a current I reaching the first link 518 is divided into two current components I/2, one of the two components reaching the fourth link 519, the other of the two components reaching the fifth link 619 after having passed opposite two consecutive adjacent cores 304, 402.

A current I reaching the second link 618 is divided into two current components I/2, one of the two components reaching the fourth link 519 after having passed opposite two consecutive adjacent cores 402, 304, the other of the two components reaching the seventh link 619, after having passed opposite two consecutive adjacent cores 404, 502.

A current I reaching the third link 718 is divided into two current components I/2, one of the two components reaching the fifth link 619 after having passed opposite two consecutive cores 502, 404, the other of the two components reaching the seventh link 719.

One contribution I/2 effects the first half of a revolution around a core and the second half around a juxtaposed adjacent core in such a way with that at the end of each revolution, each pair has actually received the total contribution of I.

The invention claimed is:

1. Micromagnetometer of the fluxgate type made of thin layers, including:
   a support having a main plane,
   a magnetic circuit fitted with at least one first magnetic core of a main direction and at least one second magnetic core parallel to the first core,
   at least one excitation coil including a succession of conductive elements connected in series, and
   means for applying an excitation signal to said series of conductive elements,
   wherein the excitation coil includes, flat conductive zones parallel to each other extending in a direction that forms a non-zero angle with said main direction and located respectively in a plane parallel to the main plane of the support, a first plurality of flat conductive zones being located opposite the first core, a second plurality of flat conductive zones being located opposite the second core, at least some conductive elements of the excitation coil including,
   at least one first flat conductive zone belonging to said second plurality of conductive zones connected to a second flat conductive zone belonging to said first plurality of flat conductive zones and located in the same plane orthogonal to the main plane of the support as said second flat conductive zone, the conductive elements of the excitation coil including
   a conductive part forming a closed contour surrounding the first and second cores, and including said first flat conductive zone and said second flat conductive zone.

2. Micromagnetometer of the fluxgate type according to claim 1, the conductive elements of the excitation coil comprising
   a first conductive link connected to said conductive part and configured to route a current coming from a previous conductive element of said series of conductive elements or means for applying the excitation signal,
   a second conductive link connected to said conductive part and configured to transmit a current to a next conductive element of said series of conductive elements or to the means for applying the excitation signal.

3. Micromagnetometer of the fluxgate type according to claim 1, said flat conductive zones of said first plurality of flat conductive zones, and of said second plurality of flat conductive zones, being orientated along a direction orthogonal to said main direction.

4. Micromagnetometer of the fluxgate type according to claim 1, wherein said first flat conductive zone and said second flat conductive zone are located in a first plane parallel to the main plane of the support, said second flat conductive zone being connected and aligned with said first flat conductive zone.

5. Micromagnetometer of the fluxgate type according to claim 1, said closed conductive contour further including:
   a third flat conductive zone and a fourth flat conductive zone connected to, and aligned with, the third flat conductive zone, the third flat conductive zone and the fourth flat conductive zone being connected respectively to said first flat conductive zone and to said second flat conductive zone and being located in a second plane, parallel to the main plane of the support and such that the cores are placed between said first plane and said second plane.

6. Micromagnetometer of the fluxgate type according to claim 5, said third flat conductive zone and fourth flat conductive zone being located in the same plane orthogonal to the main plane of the support as said first flat conductive zone and second flat conductive zone.

7. Micromagnetometer of the fluxgate type according to claim 1, said conductive part having a closed contour including a first conductive portion partially surrounding the first core and a second conductive portion partially surrounding the second core, the first conductive portion and the second conductive portion being identical.

8. Micromagnetometer of the fluxgate type according to claim 1, wherein the first conductive link and the second conductive link are located between the cores and orientated in a direction parallel to the main direction, the second link and the first link being located respectively in a first plane parallel to the main plane of the support, and in a second plane, parallel to the main plane of the support and such that the cores are placed between the first plane and the second plane.

9. Micromagnetometer of the fluxgate type according to claim 1, wherein the magnetic circuit further includes:
   one or more other juxtaposed cores parallel to each other and to the first and second cores, at least some conductive elements of the excitation coil including a plurality of flat conductive zones extending in a direction forming a non-zero angle with said main direction and located in the same plane orthogonal to the main plane of the support as said first flat conductive zone and second flat conductive zone.

10. Micromagnetometer of the fluxgate type according to claim 1, wherein the magnetic circuit further includes one or more other juxtaposed cores parallel to each other and to the first and second cores, said conductive part also surrounding said other cores.

11. Micromagnetometer of the fluxgate type according to claim 1, further including at least one detection coil wound around the cores.

12. Micromagnetometer of the fluxgate type according to claim 11, the detection coil and the excitation coil being interlaced.

13. Micromagnetometer of the fluxgate type according to claim 11, the detection coil includes a succession of turns passing respectively alternately, opposite all the cores in a first plane parallel to the main plane of the support and opposite all the cores in a second plane parallel to the main plane of the support and such that the cores are located between the first plane and the second plane.

14. Micromagnetometer of the fluxgate type according to claim 11, wherein the detection coil includes a succession of conductive turns connected in series, each of a plurality of turns of the detection coil comprising a plurality of flat conductive zones parallel to each other, located respectively opposite the cores of the magnetic circuit in a plane parallel to the main plane of the support and extending respectively in a direction forming a non-zero angle with said main direction, the flat conductive zones of the detection coil having a width larger than the width of the flat conductive zones of the excitation coil.

15. Device made of thin layers that includes:
   a first micromagnetometer of the fluxgate type according to claim 1, fitted with cores orientated along a first main direction,
   at least one second micromagnetometer of the fluxgate type according to claim 1, fitted with cores orientated along a second main direction orthogonal to said first main direction.

16. A device made of thin layers including:
- a first micromagnetometer of the fluxgate type made of thin layers, and a second micromagnetometer of the fluxgate type made of thin layers, each micromagnetometer including:
- a support having a main plane;
- a magnetic circuit having at least one first magnetic core with a main direction and at least one second magnetic core parallel to the first core;
- at least one excitation coil including a succession of conductive elements connected in series; and
- means for applying an excitation signal to said series of conductive elements,
- the excitation coil comprising flat conductive zones parallel to each other extending in a direction that forms a non-zero angle with said main direction and located respectively in a plane parallel to the main plane of the support, a first plurality of flat conductive zones being located opposite the first core, a second plurality of flat conductive zones being located opposite the second core, at least some conductive elements of the excitation coil including,
- at least one first flat conductive zone belonging to said second plurality of conductive zones connected to a second flat conductive zone belonging to said first plurality of flat conductive zones and located in the same plane orthogonal to the main plane of the support as said second flat conductive zone, the conductive elements of the excitation coil including,
- a conductive part forming a closed contour surrounding the first and second cores, and including said first flat conductive zone and said second flat conductive zone, the first micromagnetometer being fitted with cores orientated along a first main direction,
- the second micromagnetometer of the fluxgate type being fitted with cores orientated along a second main direction orthogonal to said first main direction.

17. The device according to claim 16, the conductive elements of the excitation coil comprising:
- a first conductive link connected to said conductive part and configured to route a current coming from a previous conductive element of said series of conductive elements or means for applying the excitation signal; and
- a second conductive link connected to said conductive part and configured to transmit a current to a next conductive element of said series of conductive elements or to the means for applying the excitation signal.

18. The device according to claim 16, said flat conductive zones of said first plurality of flat conductive zones, and of said second plurality of flat conductive zones, being orientated along a direction orthogonal to said main direction.

19. The device according to claim 16, wherein said first flat conductive zone and said second flat conductive zone are located in a first plane parallel to the main plane of the support, said second flat conductive zone being connected and aligned with said first flat conductive zone.

20. The device according to claim 16, said closed conductive contour further including:
- a third flat conductive zone and a fourth flat conductive zone connected to, and aligned with, the third flat conductive zone, the third flat conductive zone and the fourth flat conductive zone being connected respectively to said first flat conductive zone and to said second flat conductive zone and being located in a second plane, parallel to the main plane of the support and such that the cores are placed between said first plane and said second plane.

21. The device according to claim 20, said third flat conductive zone and fourth flat conductive zone being located in the same plane orthogonal to the main plane of the support as said first flat conductive zone and second flat conductive zone.

22. The device according to claim 16, said conductive part forming a closed contour including a first conductive portion partially surrounding the first core, and a second conductive portion partially surrounding the second core, the first conductive portion and the second conductive portion being substantially identical.

23. The device according to claim 16, wherein the first conductive link and the second conductive link are located between the cores and orientated in a direction parallel to the main direction, the second link and the first link being located respectively in a first plane parallel to the main plane of the support, and in a second plane, parallel to the main plane of the support and such that the cores are placed between the first plane and the second plane.

24. The device according to claim 16, wherein the magnetic circuit further includes:
- one or more other juxtaposed cores parallel to each other and to the first and second cores, at least some conductive elements of the excitation coil including a plurality of flat conductive zones extending in a direction forming a non-zero angle with said main direction and located in the same plane orthogonal to the main plane of the support as said first flat conductive zone and second flat conductive zone.

25. The device according to claim 16, wherein the magnetic circuit further includes:
- one or more other juxtaposed cores parallel to each other and to the first and second cores, said conductive part also surrounding said other cores.

26. The device according to claim 16, further including at least one detection coil wound around the cores.

27. The device according to claim 26, the detection coil and the excitation coil being interlaced.

28. The device according to claim 26, the detection coil including a succession of turns passing respectively alternately, opposite all the cores in a first plane parallel to the main plane of the support and opposite all the cores in a second plane parallel to the main plane of the support and such that the cores are located between the first plane and the second plane.

29. The device according to claim 26, wherein the detection coil comprises:
- a succession of conductive turns connected in series, each of a plurality of turns of the detection coil including a plurality of flat conductive zones parallel to each other, located respectively opposite the cores of the magnetic circuit in a plane parallel to the main plane of the support and extending respectively in a direction forming a non-zero angle with said main direction, the flat conductive zones of the detection coil having a width larger than the width of the flat conductive zones of the excitation coil.

* * * * *